(12) United States Patent
Bourstein et al.

(10) Patent No.: US 7,804,431 B1
(45) Date of Patent: Sep. 28, 2010

(54) METHOD AND APPARATUS FOR GENERATING DIFFERENTIAL SIGNAL

(75) Inventors: Ido Bourstein, Pardes Hana (IL); Reuven Ecker, Haifa (IL)

(73) Assignee: Marvell Israel (MISL) Ltd., Yokneam (IL)

(*) Notice: Subject to any disclaimer, the term of this patent is extended or adjusted under 35 U.S.C. 154(b) by 0 days.

(21) Appl. No.: 12/551,000

(22) Filed: Aug. 31, 2009

Related U.S. Application Data

(63) Continuation of application No. 12/134,661, filed on Jun. 6, 2008, now Pat. No. 7,592,934.

(60) Provisional application No. 60/942,336, filed on Jun. 6, 2007, provisional application No. 60/943,130, filed on Jun. 11, 2007.

(51) Int. Cl.
  *H03M 9/00* (2006.01)
(52) U.S. Cl. .................. 341/100; 341/101
(58) Field of Classification Search .............. 341/100, 341/101, 141, 143, 136; 326/38; 327/108
See application file for complete search history.

(56) References Cited

U.S. PATENT DOCUMENTS

| | | | |
|---|---|---|---|
| 6,064,707 A | 5/2000 | Woddman | |
| 6,100,830 A * | 8/2000 | Dedic | 341/136 |
| 6,703,858 B2 | 3/2004 | Knowles | |
| 7,208,984 B1 * | 4/2007 | Petrofsky | 327/108 |
| 7,525,341 B1 | 4/2009 | Rosen et al. | |
| 2008/0094117 A1 | 4/2008 | Stoler et al. | |

* cited by examiner

*Primary Examiner*—Peguy JeanPierre

(57) ABSTRACT

Aspects of the disclosure provide a circuit using digital techniques to generate a differential signal with a low skew. The circuit can include a first switching element configured to receive at least a first logic value and a second logic value, and output a first signal of the differential signal, the second logic value being different from the first logic value. Further, the circuit can include a second switching element configured to receive at least the first logic value and the second logic value, and output a second signal of the differential signal. Additionally, the circuit can include a selection signal generator coupled to the first switching element and to the second switching element, the selection signal generator being configured to provide a selection signal to the first switching element and to the second switching element, the selection signal causing the first signal to transit from the first logic value to the second logic value based on the selection signal, and causing the second signal to transit from the second logic value to the first logic value based on the selection signal.

20 Claims, 10 Drawing Sheets

US 7,804,431 B1

METHOD AND APPARATUS FOR GENERATING DIFFERENTIAL SIGNAL

This application is a continuation of U.S. patent application Ser. No. 12/134,661 filed Jun. 6, 2008, which claims the benefit of U.S. Provisional Applications No. 60/942,336, "Generation of a Low Skew Differential Signal from a Single Ended Signal" filed Jun. 6, 2007, and No. 60/943,130, "Generation of a Low Skew Differential Signal from a Single Ended Signal" filed Jun. 11, 2007. The disclosures of the prior applications are incorporated herein by reference in their entirety.

BACKGROUND

A differential signal, which can include a first signal and a second signal switching in opposite directions, can be preferred for high-speed data transmission. High-speed data transmission may require high noise immunity in order to achieve high signal integrity. The differential signal can reduce various noises, such as electromagnetic interference noise (EMI), common mode noise, and the like, due to its differential nature. Therefore, data transmission using a low skew differential signal can have increased noise immunity and noise margins.

In a conventional technique to convert a single ended digital signal to a differential signal, a current driven analog circuit can be utilized. The analog based technique may have relatively large current demands, which can increase a total power consumption of a circuit system.

SUMMARY

Aspects of the disclosure can provide a method and an apparatus using digital techniques to generate a differential signal with a low skew. Therefore, the method and the apparatus can be used in a low power circuit system.

Aspects of the disclosure can provide a circuit that generates a differential data signal. The circuit can include a first switching element configured to receive at least a first logic value and a second logic value, and output a first signal of the differential data signal, the second logic value being different from the first logic value. Further, the circuit can include a second switching element configured to receive at least the first logic value and the second logic value, and output a second signal of the differential data signal. Additionally, the circuit can include a selection signal generator coupled to the first switching element and to the second switching element, the selection signal generator being configured to provide a selection signal to the first switching element and to the second switching element, the selection signal causing the first signal to transit from the first logic value to the second logic value based on the selection signal, and causing the second signal to transit from the second logic value to the first logic value based on the selection signal.

More specifically, a transition of the first signal and a transition of the second signal are corresponding to the selection signal with a substantially constant delay.

According to an aspect of the disclosure, the first switching element can further include a first time balanced multiplexer having time balancing rise and fall, and the second switching element can include a second time balanced multiplexer.

In an embodiment, the first logic value corresponds to a voltage supply, the second logic value corresponds to ground, and the selection signal corresponds to a digital data signal.

Additionally, the first switching element can output a first digital signal at a first time in response to a clock signal to obtain the first signal of the differential data signal, and the second switching element can output a second digital signal at a second time in response to the clock signal to obtain the second signal of the differential data signal. Further, an edge of the first signal and an edge of the second signal have a substantially constant delay with respect to an edge of the clock signal, respectively.

According to another aspect of the disclosure, the circuit can further include a first sampling circuit that samples a digital signal at a first time to obtain the first logic value, and a second sampling circuit that samples the digital signal at a second time to obtain the second logic value.

Additionally, the first sampling circuit can include a first D flip-flop that samples the digital signal at a first edge of a clock signal, and the second sampling circuit can include a second D flip-flop that samples the digital signal at a second edge of the clock signal, the first edge and the second edge being different. Further, the first edge and the second edge correspond to a rising edge and a falling edge of the clock signal, respectively.

In an embodiment, the first sampling circuit can provide the first logic value to the first switching element and an opposite of the first logic value to the second switching element, and the second sampling circuit can provide the second logic value to the first switching element and an opposite of the second logic value to the second switching element.

In another embodiment, the circuit may further include a third sampling circuit that samples an opposite of the digital signal, and a fourth sampling circuit that samples the opposite of the digital signal.

Aspects of the disclosure can also provide a serializer/deserializer (SerDes). The SerDes can include a serializer configured to receive a set of parallel data streams, and convert the set of parallel data streams into a serial data stream, and a differential signal generator coupled to the serializer, the differential signal generator being configured to generate a differential data signal corresponding to the serial data stream. The differential signal generator can include a first switching element configured to receive at least a first logic value and a second logic value, and output a first signal of the differential data signal, the second logic value being different from the first logic value. Further, the differential signal generator can include a second switching element configured to receive at least the first logic value and the second logic value, and output a second signal of the differential data signal. Additionally, the differential signal generator can include a selection signal generator coupled to the first switching element and to the second switching element, the selection signal generator being configured to provide a selection signal to the first switching element and to the second switching element, the selection signal causing the first signal to transit from the first logic value to the second logic value based on the selection signal, and causing the second signal to transit from the second logic value to the first logic value based on the selection signal.

Furthermore, aspects of the disclosure can provide a method for generating a differential data signal. The method can include receiving a digital data stream having transitions between a first logic value and a second logic value. Further, the method can include activating a first circuit element to output a first signal of the differential data signal in accordance with a transition between the first logic value and the second logic value, the first signal changing from the first logic value to the second logic value in accordance with a selection signal. Additionally, the method can include activating a second circuit element to output a second signal of the differential data signal in accordance with the transition, the second signal changing from the second logic value to the first logic value in accordance with the selection signal.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Figure 1A:
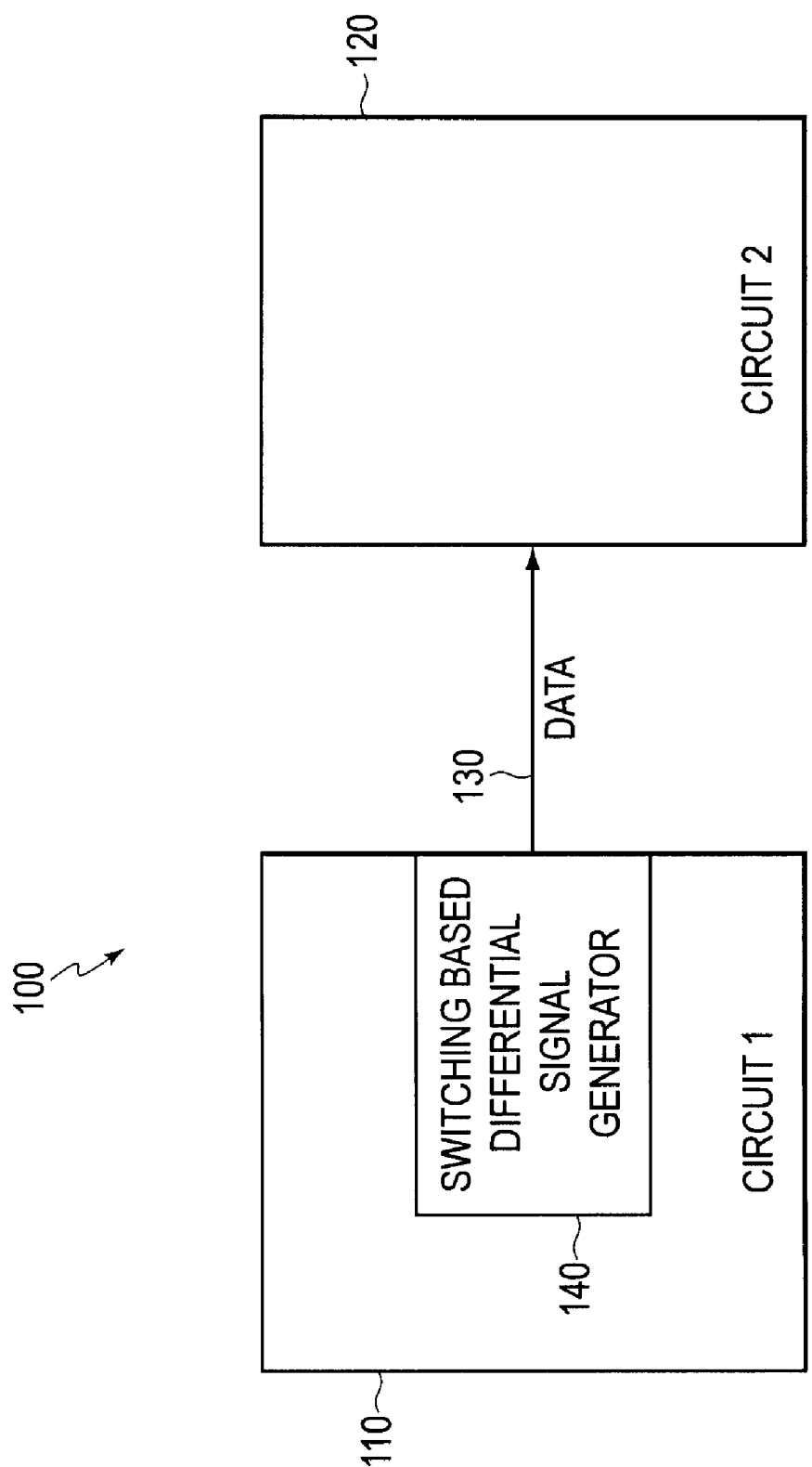
FIGS. 1A and 1B show examples of circuit systems including a switching based differential signal generator for generating a differential data signal.
Figure 1B:
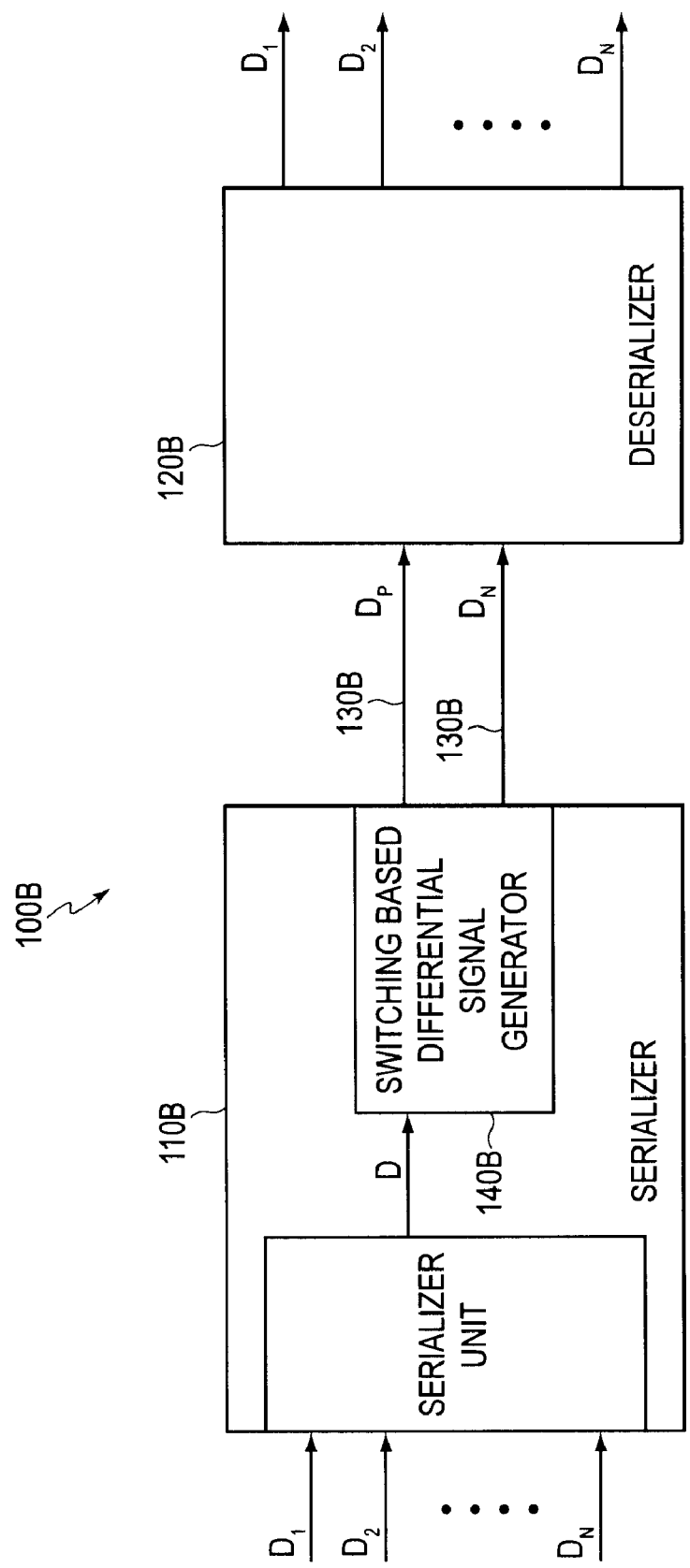

FIGS. 1A and 1B show examples of circuit systems using a switching based differential signal generator according to the disclosure. FIG. 1A shows a circuit system 100, which can include a first circuit 110 and a second circuit 120 coupled by a transmission link 130. The first circuit 110 may desire to transmit a data stream to the second circuit 120 via the transmission link 130. The first circuit 110 can include a switching based differential signal generator 140 that can generate a differential data signal corresponding to the data stream. The differential data signal can be transmitted by the transmission link 130 with increased noise immunity and noise margins.

The first and second circuits 110 and 120 can include any integrated circuits or discrete circuits that may desire to use the transmission link 130 to transmit the data stream. For example, the first and second circuits 110 and 120 can include integrated circuit (IC) blocks, such as application specific IC (ASIC) blocks, memory blocks, digital intellectual property (IP) blocks, CPU blocks, analog IP blocks, and the like, within a semiconductor package. In addition, the first and second circuits 110 and 120 can include IC chips, such as microprocessor chips, memory chips, digital signal processing (DSP) chips, and the like. Further, the first and second circuits 110 and 120 can include printed circuit boards (PCB), such as CPU boards, memory boards, Ethernet boards, and the like.

The transmission link 130 can include various couplings. For example, the transmission link 130 can include any connecting techniques within a semiconductor device, such as doped polysilicon lines, metal lines, and the like. In addition, the transmission link 130 can include connecting techniques for IC chips, such as printed metal lines on a PCB. Further, the transmission link 130 can include connecting techniques for PCB boards, such as coaxial cable, fiber cable, and the like. Additionally, the transmission link 130 may include various wireless connecting techniques. It should be understood that the transmission link 130 can include combinations of the various wired or wireless connections.

The switching based differential signal generator 140 can receive a single ended signal, e.g., corresponding to the data stream and convert the data stream into the differential data signal. According to the disclosure, the switching based differential signal generator 140 can include various digital circuits, such as standard cells from a digital circuit library, customized digital circuits, and the like, to perform the above functions. The differential signal generator 140 can consume a reduced power due to the digital implementation. In addition, the differential signal generator 140 can generate the differential data signal with a low skew, which can be defined as a timing difference between a first signal and a second signal of the differential data signal, using techniques disclosed herein.

FIG. 1B shows an example of a serializer/deserializer (SerDes) system 100B. The SerDes system 100B may include a serializer 110B, a deserializer 120B, coupled by a differential transmission link 130B. The serializer 110B can receive a set of parallel data streams, such as $D_1$-$D_N$, at a moderate switching speed and convert them to a high switching speed data stream D. The serializer 110 may include a switching based signal generator 140B. The switching based differential signal generator 140B can then convert the high switching speed data stream D into a differential data signal, which can include a first signal $D_P$ and a second signal $D_N$ switching in opposite direction. Further, the differential data signal can be transmitted to a remote receiver via the differential transmission link 130B. Generally, at the remote end of the differential transmission link 130, the differential data signal can be deserialized back to a set of parallel data streams at a moderate switching speed by the deserializer 120B.

Figure 2C:
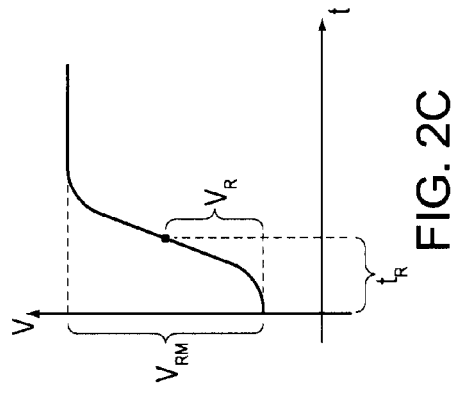
FIGS. 2A-2C show a block diagram example of a differential signal generator for generating a differential data signal and transition characteristics.
Figure 2A:
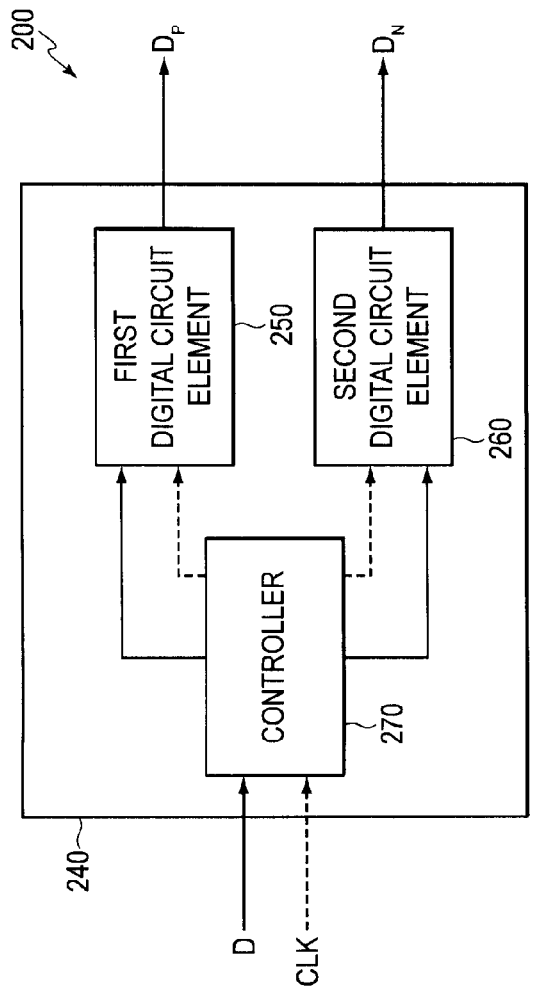
Figure 2B:
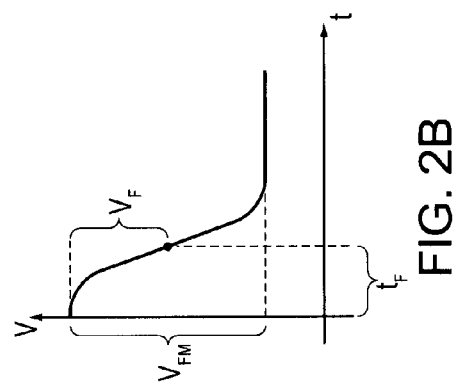

FIGS. 2A-C show an example of a differential signal generator and its switching characteristics in accordance with an embodiment. The differential signal generator 240 can receive a single ended digital signal D, such as a data stream at a high switching speed, and output a corresponding differential data signal, which can include a positive signal $D_P$ and a negative signal $D_N$. The digital signal generator 240 can include a first digital circuit element 250 generating the positive signal $D_P$, and a second digital circuit element 260 generating the negative signal $D_N$. In addition, the differential signal generator 240 can optionally include a controller 270 that can provide control signals to the first and second digital circuit elements 250 and 260 to enable proper operations of the differential signal generator 240. These elements can be coupled as shown in FIG. 2A.

The first digital circuit element 250 can include a timing control input. The timing control input may activate a transition, such as a transition from a logic high to a logic low having a falling edge, and a transition from the logic low to the logic high having a rising edge, of the positive signal $D_P$ with regard to the timing control input. In an embodiment, the first digital circuit element 250 can be configured as a multiplexer that a selector of the multiplexer can be configured as a timing control input, such as disclosed in Applicant's copending U.S. patent application Ser. No. 11/093,080, filed Mar. 28, 2005, which is incorporated herein by reference in its entirety.

Similarly, the second digital circuit element 260 can also include a timing control input. The timing control input may activate a transition, such as a transition having a falling edge, and a transition having a rising edge, of the negative signal $D_N$ with regard to the timing control input. In an embodiment, the second digital circuit element 250 can be configured as a multiplexer that a selector of the multiplexer can be configured as a timing control input.

The first digital circuit element 250 and the second digital circuit element 260 can be a time balanced pair, which can mean that switching characteristics, including a rising edge characteristic and a falling edge characteristic, of the first digital circuit element 250 match switching characteristics of the second digital circuit element 260. In other word, a rising edge characteristic of the first digital circuit element 250 can substantially match a falling edge characteristic of the second digital circuit element 260, and a falling edge characteristic of the first digital circuit element 250 can substantially match a rising edge of the second digital circuit element 260. More specifically, a falling ratio as a function of time of the first digital circuit element 250 can match a rising ratio as a function of time of the second digital circuit element 260, and a rising ratio as a function of time of the first digital circuit element 250 can match a falling ratio as a function of time of the second digital circuit element 260 as well.

FIG. 2B shows an example of a falling edge characteristic. The falling edge characteristic can include a falling ratio that can be defined as a ratio of a falling amplitude $V_F$ to a maximum falling amplitude $V_{FM}$. As can be seen, the falling ratio can vary from 0 to 1 with regard to a falling time.

FIG. 2C shows an example of a rising edge characteristic. The rising edge characteristic can include a rising ratio that can be defined as a ratio of a rising amplitude $V_R$ to a maximum rising amplitude $V_{RM}$. As can be seen, the rising ratio can also vary from 0 to 1 with regard to a rising time.

Accordingly, the time balanced pair, including the first digital circuit element 250 and the second digital circuit element 260, can substantially satisfy Equation 1:

$$\frac{V_{F1}}{V_{FM1}}(\Delta t_{F1} = t) = \frac{V_{R2}}{V_{RM2}}(\Delta t_{R2} = t) \quad (1)$$

where $V_{F1}$ denotes the falling amplitude of the first digital circuit element 250, $V_{FM1}$ denotes the maximum falling amplitude of the first digital circuit element 250, $\Delta t_{F1}$ denotes a falling time referring to a trigger of the timing control input of the first digital circuit element 250, $V_{R2}$ denotes the rising amplitude of the second digital circuit element 260, $V_{RM2}$ denotes the maximum rising amplitude of the second digital circuit element 260, $\Delta t_{R2}$ denotes a rising time referring to a trigger of the timing control input of the second digital circuit element 260, and t denotes a time value.

Similarly, the time balanced pair can substantially satisfy Equation 2:

$$\frac{V_{F2}}{V_{FM2}}(\Delta t_{F2} = t) = \frac{V_{R1}}{V_{RM1}}(\Delta t_{R1} = t) \quad (2)$$

where $V_{F2}$ denotes the falling amplitude of the second digital circuit element 260, $V_{FM2}$ denotes the maximum falling amplitude of the second digital circuit element 260, $\Delta t_{F2}$ denotes a falling time referring to a trigger of the timing control input of the second digital circuit element 260, $V_R$/denotes the rising amplitude of the first digital circuit element 250, $V_{RM1}$ denotes the maximum rising amplitude of the first digital circuit element 250, $\Delta t_{R1}$ denotes a rising time referring to a trigger of the timing control input of the first digital circuit element 250, and t denotes a time value.

The time balanced pair 250 and 260 can include various circuit element pairs, such as time balanced multiplexer pair, time balanced flip-flop pair, time balanced latch pair, time balanced passing gate pair, and the like, that can substantially satisfy the above equations. In an embodiment, the first digital circuit element 250 itself is time balanced, so is the second digital circuit element 260. The time balanced circuit element can have a rising edge characteristic and a falling edge characteristic that are substantially time balanced. For example, a standard cell library may include a time balanced multiplexer having time balanced rising edge and falling edge with regard to a selector, as described in Applicant's copending U.S. patent application Ser. No. 11/093,080. The first element 250 can include an instance of the time balanced multiplexer, and the second element 260 can include another instance of the time balanced multiplexer as well.

The controller 270 can include any auxiliary logic circuits or couplings. The controller 270 may receive signals, such as data signals, clock signals, and the like, and can provide the signals to the timing control inputs of the first digital circuit element 250 and the second digital circuit element 260. In an embodiment, the controller 270 may transmit the data input D to selector inputs of a pair of time balanced multiplexers, such that the pair of time balanced multiplexers have a common selector input. In another embodiment, the controller 270 may receive a clock signal CLK, and transmit the clock signal CLK to selector inputs of a pair of time balanced multiplexers, such that the pair of time balanced multiplexers have a common selector input. In another embodiment, the controller 270 may receive a clock signal CLK, and transmit the clock signal CLK to clock inputs of a pair of time balanced elements, such that the pair of time balanced elements have a common clock input.

During operation, when the single ended digital signal D switches from a logic low to a logic high, the controller 270 can provide a first timing signal to the first circuit element 250, which can result in a rising edge of the positive signal $D_P$. In addition, the controller 270 can provide a second timing signal to the second circuit element 260, which can result in a falling edge of the negative signal $D_N$. In an embodiment, the first timing signal can match the second timing signal. Then, the rising edge of the positive signal $D_P$ and the falling edge of the negative signal $D_N$ can have a low skew, due to that reason that the rising edge characteristic of the first circuit element 250 matches the falling edge characteristic of the second circuit element 260.

On the other hand, when the single ended digital signal D switches from the logic high to the logic low, the controller 270 can provide the first timing signal to the first circuit element 250, which can result in a falling edge of the positive signal $D_P$. In addition, the controller 270 can provide the second timing signal to the second circuit element 260, which can result in a rising edge of the negative signal $D_N$. In an embodiment, the first timing signal can match the second timing signal. Then, the falling edge of the positive signal $D_P$ and the rising edge of the negative signal $D_N$ can have a low skew, due to the reason that the falling edge characteristic of the first circuit element 250 matches the rising edge characteristic of the second circuit element 260.

In an embodiment, the first and the second timing signals can be based on a clock signal, which can have desired transition characteristics, such as sharp rising and failing edges. Therefore, the positive signal $D_P$ and the negative signal $D_N$ can have, for example sharp rising and failing edges, even though the single ended digital signal D may have mis-balanced rising and failing edges.

Figure 3:
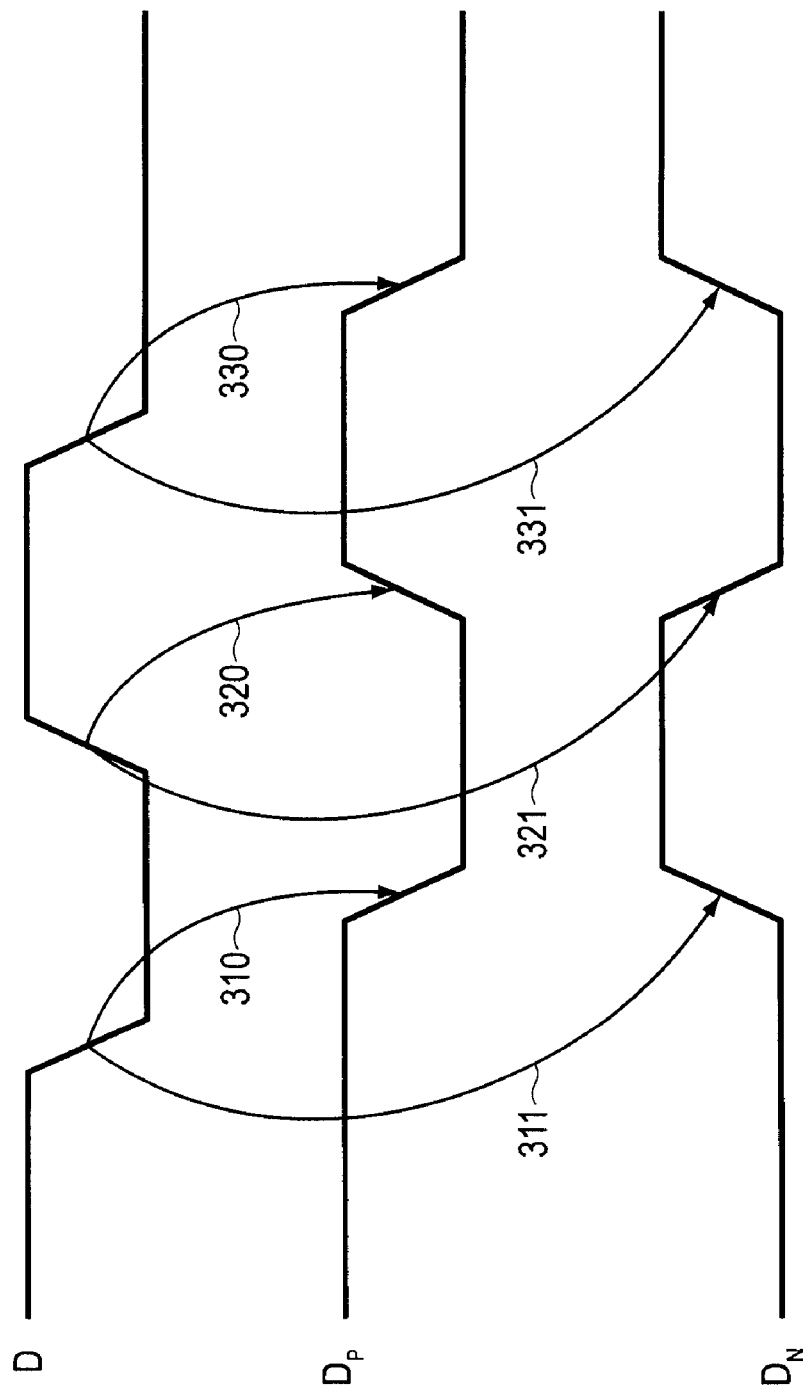
FIG. 3 shows an example of waveforms of a differential signal generator for generating a differential data signal.

FIG. 3 shows an example of waveforms of the differential signal generator 240. As can be seen, the single ended digital signal D can switch between a logic high and a logic low. The switching of the single ended digital signal D can result in a switching of the differential data signal including a positive signal $D_P$ and negative signal $D_N$. For example, when the single ended digital signal D switches from the logic high to the logic low, the positive signal $D_P$ can also switch from the logic high to the logic low as indicated by 310, while the negative signal $D_N$ can switch from the logic low to the logic high as indicated by 311. On the other hand, when the single ended digital signal D switches from the logic low to the logic high, the positive signal $D_P$ can switch from the logic low to the logic high as indicated by 320, while the negative signal $D_N$ can switch from the logic high to the logic low as indicated by 321.

As can be seen, the falling edge 310 of the positive signal $D_P$ can match the rising edge 311 of the negative signal $D_N$. Similarly, the rising edge 320 of the positive signal $D_P$ can match the falling edge 321 of the negative signal $D_N$. Therefore, the positive signal $D_P$ and the negative signal $D_N$ can have a low skew. In an embodiment, the falling edges and the rising edges of the positive signal $D_P$ and the negative signal $D_N$ can all match.

While signals in FIG. 3 are shown with same voltage values for logic high and logic low, each signal may have its own voltage values for its logic high and logic low.

Figure 4:
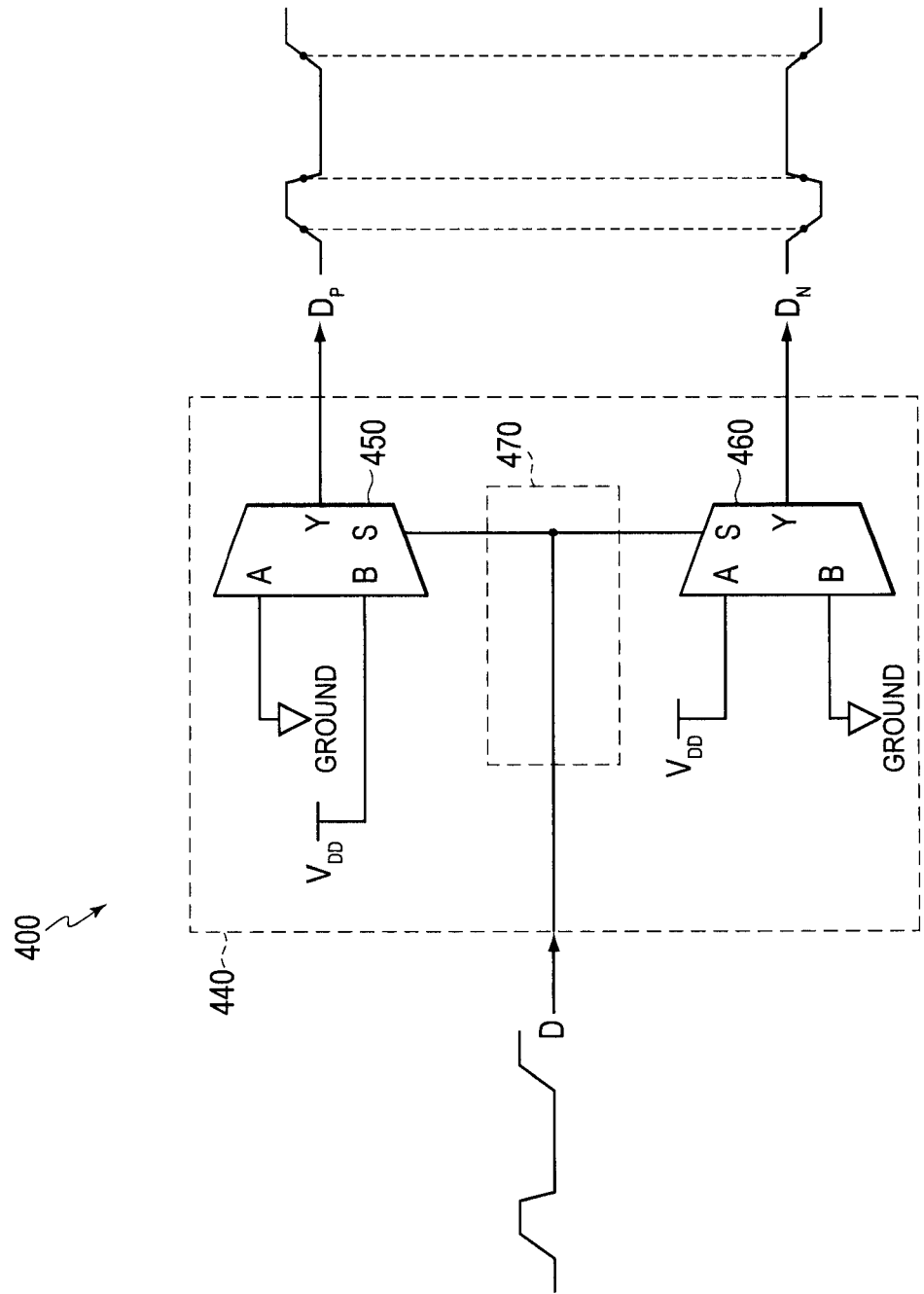
FIG. 4 shows an example of a differential signal generator for generating a differential data signal.

FIG. 4 shows an example of a differential signal generator according to the disclosure. The differential signal generator 440 can include a first multiplexer 450 that can output a positive signal $D_P$, and a second multiplexer 460 that can output a negative signal $D_N$. In addition, the differential signal generator 440 can include a controller 470 that can be configured to couple a single ended digital signal D to the first multiplexer 450 and the second multiplexer 460. These elements can be coupled as shown in FIG. 4.

The first multiplexer 450 can have a data input A coupled to a low voltage, such as ground, as well as a data input B coupled to a high voltage, such as $V_{dd}$ voltage supply. In addition, the first multiplexer 450 can have a selector S coupled to the single-ended digital signal D. On the other hand, the second multiplexer 460 can have a data input A coupled to a high voltage, such as $V_{dd}$ voltage supply, as well as a data input B coupled to a low voltage, such as ground. In addition, the second multiplexer 460 can have a selector S coupled to the single-ended digital signal D as well.

The first multiplexer 450 can be configured in a way that the selector S can be a timing control input. Therefore, an output transition of the first multiplexer 450 can correspond to a transition of the selector S with a substantial constant delay, such as disclosed in Applicant's copending U.S. patent application Ser. No. 11/093,080. Similarly, the second multiplexer 460 can be configured in a way that the selector S can be a timing control input as well. In addition, the first multiplexer 450 and the second multiplexer 460 can be a time balance pair. In an embodiment, the first multiplexer 450, as well as the second multiplexer 460, can be a time balanced multiplexer, such as disclosed in Applicant's copending U.S. patent application Ser. No. 11/093,080. For example, a digital circuit library may include a time balanced multiplexer that can have a rising edge characteristic referring to a switch of the selector S, and a falling edge characteristic referring to a switch of the selector S, that are time balanced. The first multiplexer 450 can be an instance of the time balanced multiplexer, and the second multiplexer 460 can be another instance of the time balanced multiplexer.

During operation, the positive signal $D_P$ and the negative signal $D_N$ can switch between a logic high and a logic low with regard to the singled ended digital signal D. When the single ended digital signal D is at the logic low, the first multiplexer 450 can output the positive signal $D_P$ at the logic low, while the second multiplexer 460 can output the negative signal $D_N$ at the logic high. Additionally, when the single ended digital signal D is at the logic high, the first multiplexer 450 can output the positive signal $D_P$ at the logic high, while the second multiplexer 460 can output the negative signal $D_N$ at the logic low. Therefore, a rising edge of the single ended digital signal D can result in a rising edge of the positive signal $D_P$, and a falling edge of the negative signal $D_N$, while a falling edge of the single ended digital signal D can result in a falling edge of the positive signal $D_P$, and a rising edge of the negative signal $D_N$. As mentioned, the first multiplexer 450 and the second multiplexer 460 can both be time balanced multiplexers, and form a time balanced pair. Consequently, the positive signal $D_P$ and the negative signal $D_N$ can have a low skew as a result of the uniform delays in the time balanced multiplexers.

The example of FIG. 4 can provide a simple technique to generate a differential data signal in accordance to a single ended digital signal. However, a distortion in the single ended digital signal, for example different rise time vs. fall time, may result in a distortion in the differential data signal due to the reason that the single ended digital signal is coupled to the timing control inputs of the first and second multiplexer 450 and 460.

Figure 5:
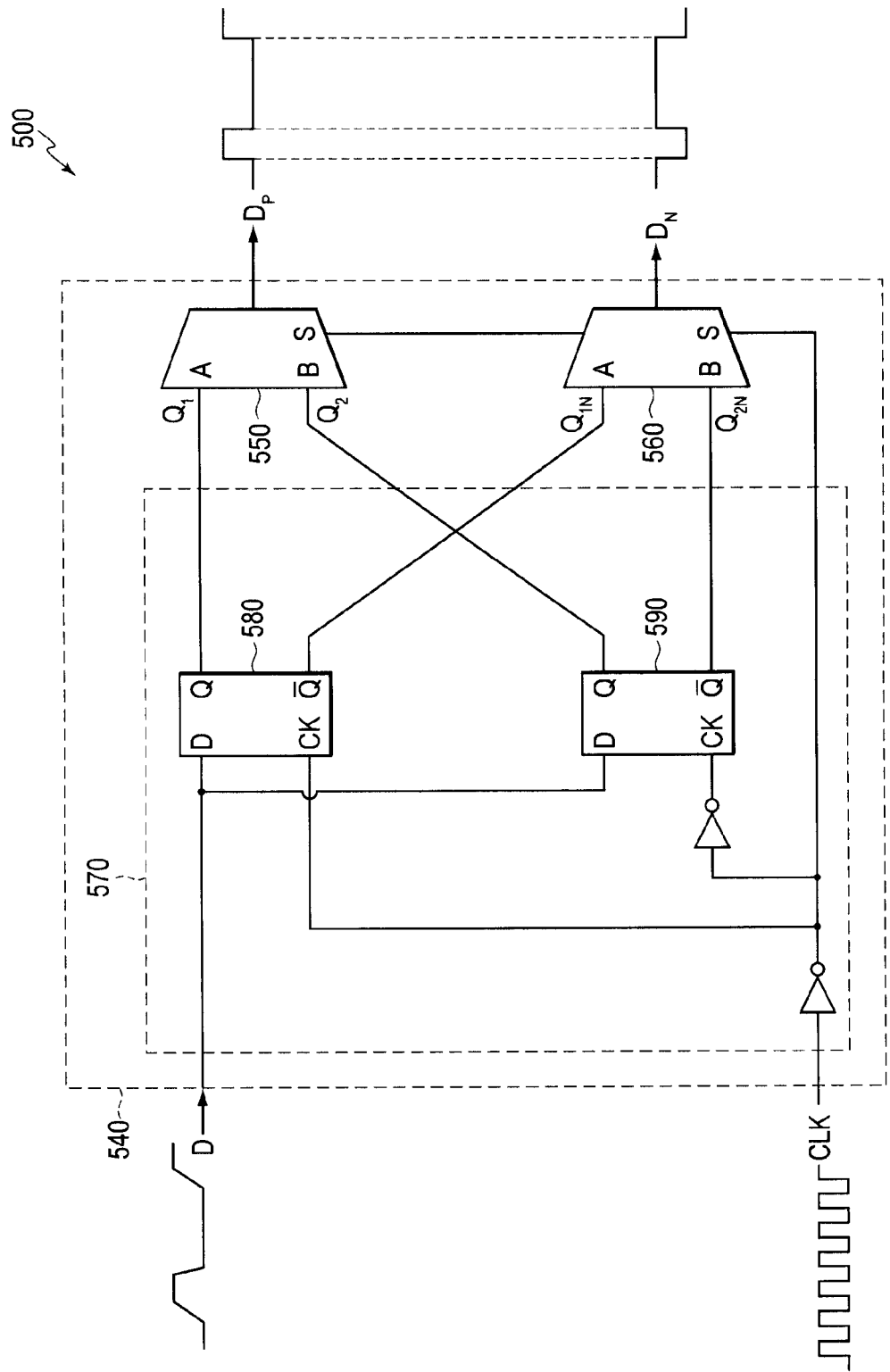
FIG. 5 shows an example of another differential signal generator for generating a differential data signal.

FIG. 5 shows another example of a differential signal generator according to the disclosure. The differential signal generator 540 can also include a first multiplexer 550 and a second multiplexer 560. In addition, the differential signal generator 540 can include a controller 570 that can receive signals, such as data signals, clock signals, and the like, and provide the signals to data inputs and selectors to the first and the second multiplexers 550 and 560. These elements can be coupled as shown in FIG. 5.

The first multiplexer 550 can be configured in a way that the selector S can be a timing control input. Therefore, an output transition of the first multiplexer 550 can correspond to a transition of the selector S with a substantial constant delay, such as disclosed in applicant's copending U.S. patent application Ser. No. 11/093,080. Similarly, the second multiplexer 560 can be configured in a way that the selector S can be a timing control input. In addition, the first multiplexer 550 and the second multiplexer 560 can be a time balance pair. In an embodiment, the first multiplexer 550, as well as the second multiplexer 560, can include a time balanced multiplexer, as disclosed in Applicant's copending U.S. patent application Ser. No. 11/093,080. For example, a digital circuit library may include a time balanced multiplexer that can have a rising edge characteristic referring to a switch of the selector S, and a falling edge characteristic referring to a switch of the selector S, that are time balanced. The first multiplexer 550 can be an instance of the time balanced multiplexer, and the second multiplexer 560 can be another instance of the time balanced multiplexer.

Different from the example in FIG. 4, the selectors S of the first multiplexer 550 and the second multiplexer 560 can be coupled to a clock signal CLK that can be provided by the controller 570. In an embodiment, the controller 570 may receive a clock signal from a system clock or a derivative of the system clock and couple the clock signal to the multiplexers 550 and 560. The clock signal CLK can be carefully configured to have little distortion, therefore the differential data signal ($D_P$ and $D_N$) can have better signal integrity compared to the original single ended digital signal D. The clock signal CLK may synchronize the outputs of the multiplexers 550 and 560 respectively.

In addition to the above difference, data inputs of the first and second multiplexers 550 and 560 can correspond to the single ended digital signal D, instead of constant voltages. The controller 570 can include a first sampling element 580, such as D-flip-flop, and a second sampling element 590, such as D-flip-flop. The first sampling element 580 and the second sampling element 590 can be configured to sample the single ended digital signal D at different time. For example, the clock signal CLK can be coupled to the first sampling element 580 and the second sampling element 590 as shown in FIG. 5. Therefore, the first sampling element 580 can sample the single ended digital signal D at a rising edge of the clock signal CLK, while the second sampling element 590 can sample the single ended digital signal D at a falling edge of the clock signal CLK.

The first sampling element 580 and the second sampling element 590 can be coupled to the first multiplexer 550 and the second multiplexer 560 as shown in FIG. 5. Therefore, the first multiplexer 550 can receive positive samples of the single ended digital signal D, while the second multiplexer 560 can receive negative samples of the single ended digital signal D. In accordance with an embodiment, the arrangement of a multiplexer, sampling elements, clock and data inputs can suitably adapt arrangement shown and described in Applicant's copending U.S. patent application Ser. No. 11/876,526, which is incorporated herein by reference in its entirety.

During operation, the first multiplexer 550 can receive a first positive sample of the single ended digital signal D at a data input A, and a second positive sample of the single ended digital signal D at a data input B. In addition, the first multiplexer 550 can receive a timing control signal at the selector S. When the single ended digital signal D switches, the data input A and data input B of the first multiplexer 550 can be different. For example, the data input A can be a sample of the single ended digital signal D before it switches, while the data input B can be a sample of the single ended digital signal D after it switches. Subsequently, when the selector S switches in response to the clock signal CLK, the positive signal $D_P$, which is an output of the first multiplexer 550, can switch accordingly in correspondence to the clock signal CLK.

Similarly, the second multiplexer 560 can receive a first negative sample of the single ended digital signal D at a data input A, and a second negative sample of the single ended digital signal D at a data input B. In addition, the second multiplexer 560 can receive a timing control signal at the selector S. When the single ended digital signal D switches, the data input A and data input B of the second multiplexer 560 can be different. For example, the data input A can be a negative sample of the single ended digital signal D before it switches, while the data input B can be a negative sample of the single ended digital signal D after it switches. Subsequently, when the selector S switches in response to the clock signal CLK, the negative signal $D_N$, which is an output of the second multiplexer 560, can switch accordingly in corresponding to the clock signal.

Figure 6:
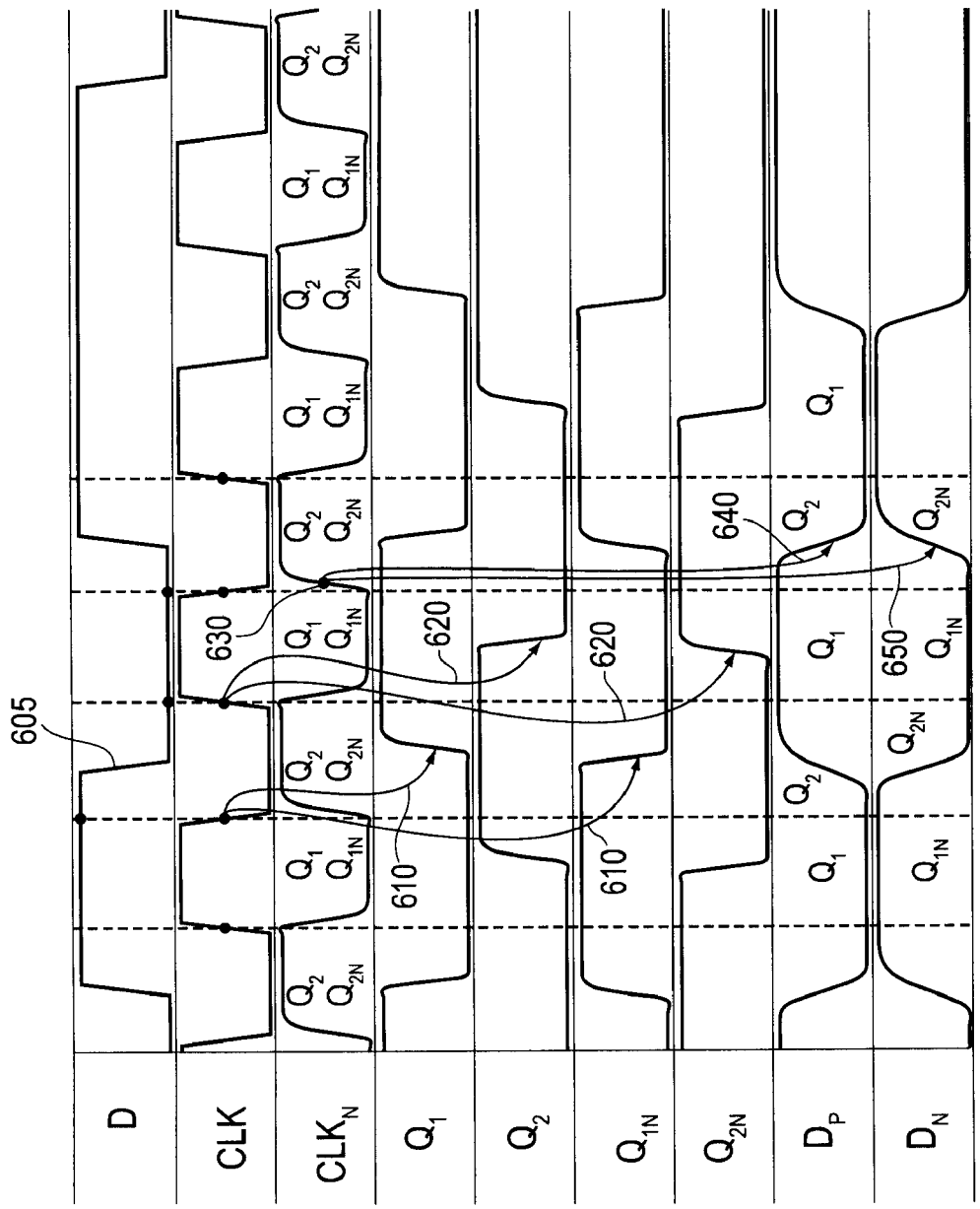
FIG. 6 shows an example of simulation waveforms of a differential signal generator for generating differential data signal.

FIG. 6 shows an example of simulation waveforms of the example in FIG. 5. The waveforms can include a single ended digital signal D, clock signals CLK and $CLK_N$, first sampling signals $Q_1$ and $Q_{1N}$, second sampling signals $Q_2$ and $Q_{2N}$, and a differential data signal including a positive signal $D_P$ and a negative signal $D_N$. Generally, the clock signals CLK and $CLK_N$ can have higher frequency than the single digital ended signal D, such that the clock signals CLK and $CLK_N$ can be used to sample the single ended digital signal D.

According to the example in FIG. 5, the data input A of the first multiplexer 550, as well as the data input A of the second multiplexer 560, can receive a sample of the single ended digital signal D at a failing edge of the clock signal CLK. Similarly, the data input B of the first multiplexer 550, as well as the data input B of the second multiplexer 560 can receive a sample of the single ended digital signal D at a rising edge of the clock signal CLK. Therefore, when the single ended digital signal D switches, the data inputs A and B of the first multiplexer 550, as well as the data inputs A and B of the second multiplexer 560, can be different. Further, a transition of the clock signal $CLK_N$ can result in a change of the selector S of both the first and second multiplexer, which can further result in transitions of the positive signal $D_P$ and the negative signal $D_N$. Due to the reason that the first and second multiplexers can be a pair of time balanced multiplexers, the transitions of the positive signal $D_P$ and the negative signal $D_N$ can correspond to the transition of the clock signal $CLK_N$ with a substantially constant delay. Therefore, the differential data signal, which include the positive signal $D_P$ and the negative signal $D_N$, can have a low skew. In addition, distortions of the digital signal D, such as different rising time vs. fall time for transitions, can be avoided in the differential data signal.

For example, the single ended digital signal D can have a transition as indicated by 605 in FIG. 6. Accordingly, $Q_1$ and $Q_{1N}$ can be a positive and a negative sample of the single ended digital signal D at a falling edge of the clock signal CLK, as indicated by 610, which is before the switch 605. $Q_2$ and $Q_{2N}$ can be a positive and a negative sample of the single ended digital signal D at a rising edge of the clock signal CLK, as indicated by 620, which is after the switch 605. Consequently, when the clock signal $CLK_N$, which is coupled to the selector S as shown in FIG. 5, switches from low to high, as indicated by 630 in FIG. 6, the positive signal $D_P$ can vary from high to low as indicated by 640, while the negative signal $D_N$ can vary from low to high as indicated by 650 in FIG. 6. Transitions of the positive signal $D_P$ and the negative signal $D_N$ can correspond to transitions of the clock signal $CLK_N$ with a substantially constant delay respectively.

Due to the reason that the first multiplexer 550 and the second multiplexer 560 can be a pair of time balanced multiplexers, the differential data signal including the positive signal $D_P$ and the negative signal $D_N$ can be configured to have a low skew, as can be seen in FIG. 6.

The above examples show digital implementations of generating the differential data signal. The digital implementations may provide a benefit of high design efficiency, such as using cells in a standard library, in addition to benefits of power saving and low skew.

Figure 7:
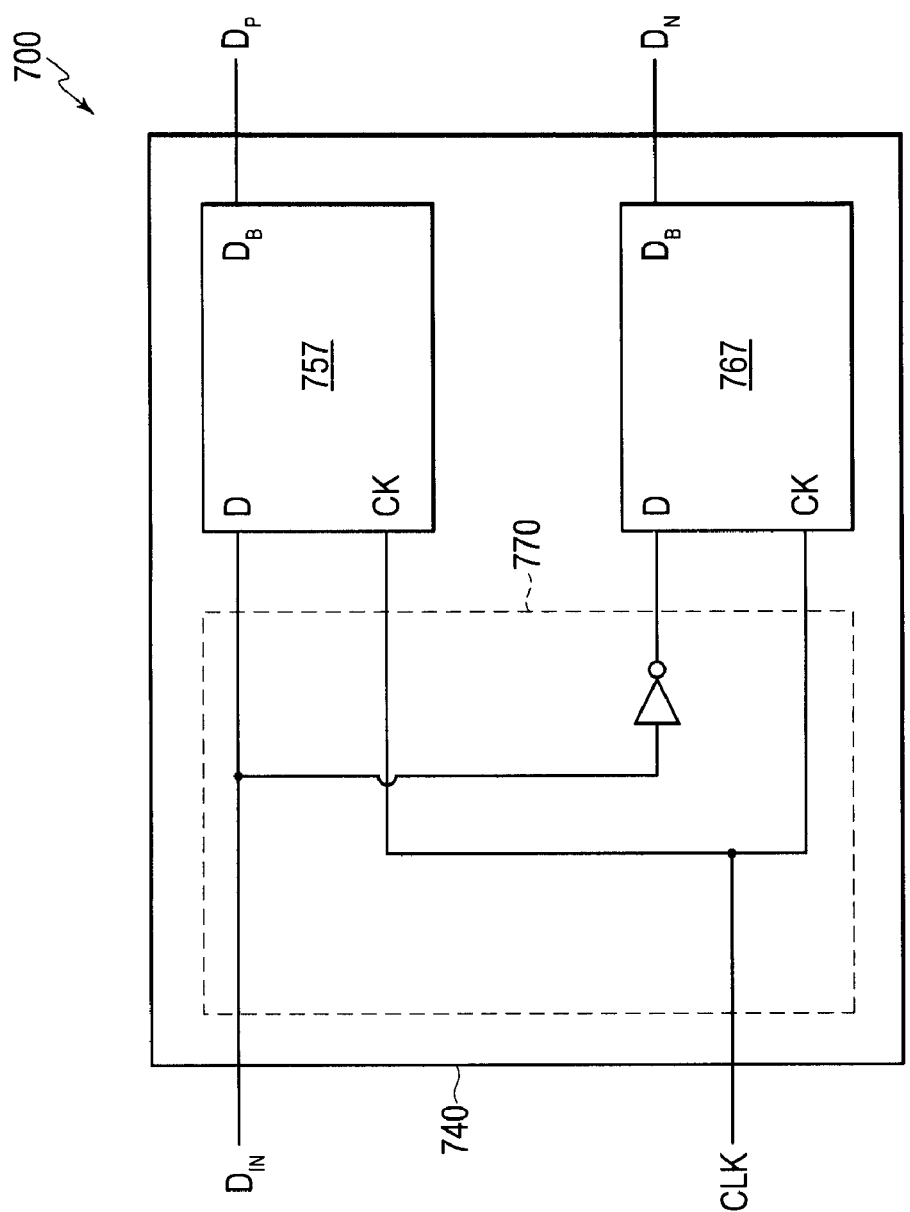
FIG. 7 shows an example of a differential signal generator using instances of a time balanced circuit cell.

FIG. 7 shows another example of a differential signal generator using instances of a time balanced circuit cell, such as the clock signal generator disclosed in Applicant's copending U.S. patent application Ser. No. 11/876,526. The differential signal generator 740 can include a first instance 757 of the time balanced circuit cell and a second instance 767 of the time balanced circuit cell. In addition, the differential signal generator 740 can include a controller 770 that can provide data inputs and clock inputs to the first instance 757 and the second instance 767. These elements can be coupled as shown in FIG. 7.

The time balanced circuit cell may include a data input D, a clock input CK, and a data output $D_B$. The time balanced circuit cell can be configured to receive a data signal from the data input D, and a clock signal from the clock input CK. Further, the time balanced circuit cell can be configured to provide an output signal from the data output $D_B$. The output signal can be a time balanced data signal. In other words, the output signal can have values corresponding to the received data signal, however transitions of the output signal can correspond to the received clock signal with a substantially constant delay.

The controller 770 can receive a single ended digital signal $D_{IN}$, and provide a positive version of the single ended digital signal $D_{IN}$ to the data input D of the first instance 757 and a negative version of the single ended digital signal $D_{IN}$ to the second instance 767. In addition, the controller 770 can receive a clock signal CLK, such as a system clock or a derivative of the system clock, and provide the clock signal CLK to the clock inputs CK of the first instance 757 and the second instance 767. Therefore, the first instance 757 can output a time balanced positive signal $D_P$ with regard to the clock signal CLK, while the second instance 767 can output a time balanced negative signal $D_N$ with regard to the clock signal CLK. Due to the reason that the time balanced positive signal $D_P$ and the time balanced negative signal $D_N$ are both synchronized to the common clock signal, the signal pair can have a low skew.

Figure 8:
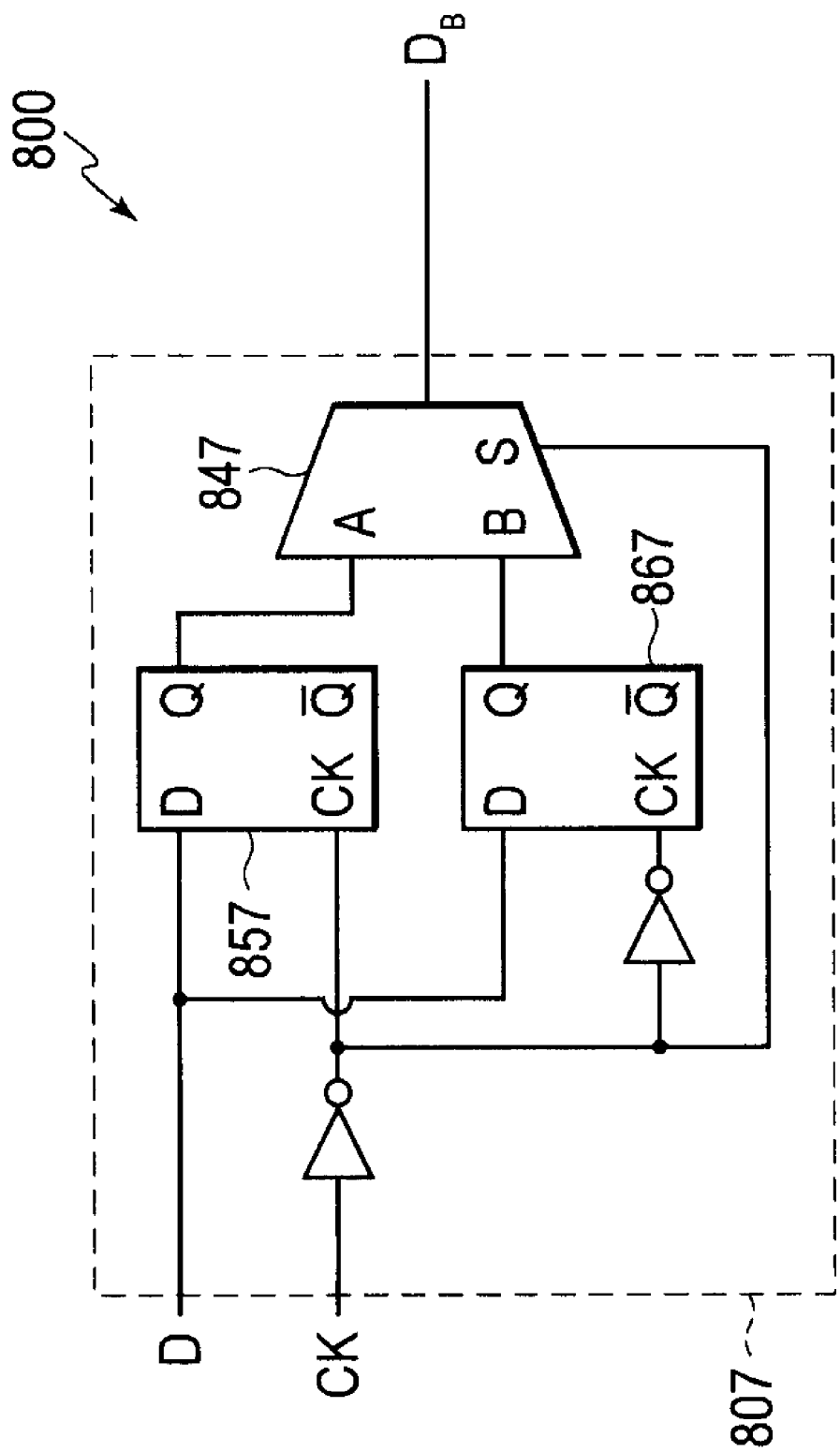
FIG. 8 shows an example of a time balanced circuit cell in a standard library.

FIG. 8 shows an example of a time balanced circuit cell in a standard library that can be suitable for generating either of signals $D_P$ or $D_N$. The time balanced circuit cell 807 can receive a data input D having an input pattern, as well as a clock input CK, and output a time balanced signal $D_B$ having an output pattern that corresponds to the input pattern. The time balanced signal can have transitions corresponding to the clock input CK with a substantially constant delay. The time balanced circuit cell 807 can include a time balanced multiplexer 847, a first D flip-flop 857 and a second D flip-flop 867. These elements can be coupled as shown in FIG. 8.

The time balanced multiplexer 847 can have time balanced rising and falling edge characteristics with regard to its selector S as described above. The first D flip-flop 857 and the second D flip-flop 867 can work similar as the D flip-flops in FIG. 5. More specifically, the first D flip-flop 857 can sample the data input D at a falling edge of the clock input CK, while the second D flip-flop 867 can sample the data input D at a rising edge of the clock input CK. Samples of the data input D can be coupled to inputs of the time balanced multiplexer 847. Further, the clock input CK, which is also coupled to the selector S of the time balanced multiplexer 847, can control the time balanced multiplexer 847 to output a time balanced digital signal. Further detail regarding the structure and operation of the time balanced circuit cell can be found with regard to the clock signal generator in Applicant's copending U.S. patent application Ser. No. 11/876,526.

Figure 9:
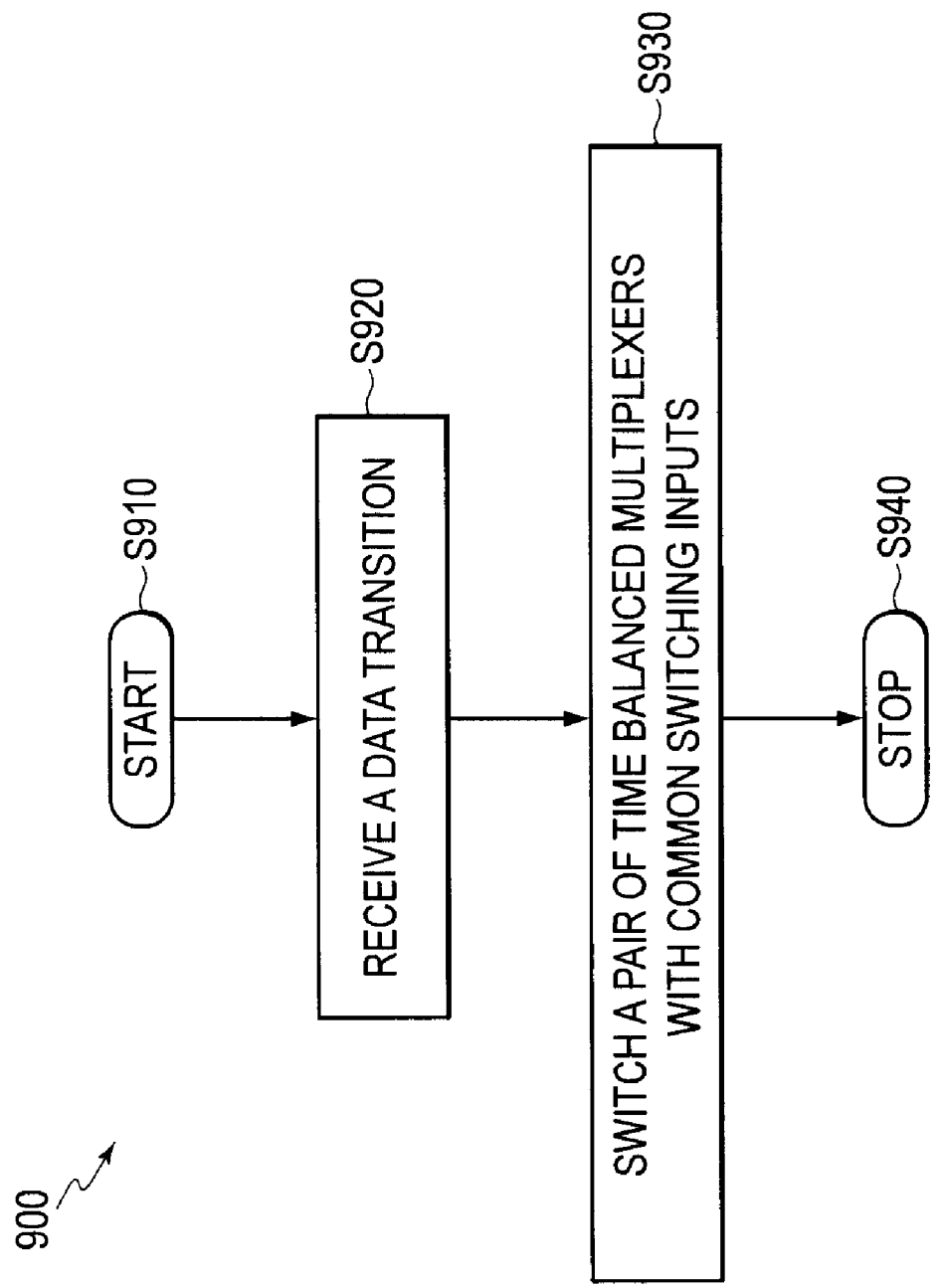
FIG. 9 shows an example of a flowchart outlining a process of generating a differential data signal.

FIG. 9 shows an example of a flowchart outlining a process of generating a differential data signal. The process starts at step S910, and proceeds to step S920. In step S920, a switch can be received. For example, a data stream may be received. The data stream may include a data switch, such as from a logic low to a logic high. The process then proceeds to S930.

In step S930, a pair of time balanced circuit elements can receive a common switching input, and can switch in accordance to the data switch. The common switching input can be, for example a common data input or a common clock. In an embodiment, the pair of time balanced circuit elements can be a pair of time balanced multiplexers. The pair of time balanced multiplexers can received the common input at their selectors. The time balanced circuit elements can have time balanced switching edges. For example, a first circuit element of the pair can have a falling edge characteristic that matches a rising edge characteristic of a second circuit element of the pair, and a rising edge characteristic that matches a falling edge characteristic of the second circuit element of the pair. In an embodiment, the first circuit element, as well as the second circuit element, can be a time balanced circuit element that the rising edge characteristic and the falling edge characteristic of its own can be substantially time balanced.

The first circuit element may switch positively corresponding to the data switch, while the second circuit element may switch negatively corresponding to the data switch. Consequently, a differential data signal, which includes a first signal and a second signal switching in opposite direction can be generated. The differential data signal can have a low skew due to the time balanced characteristics of the first and second circuit elements, and/or the common switching input. The process then proceeds to step S940, and terminates.

While the examples utilize multiplexers with two data inputs, it should be understood that multiplexers with more than two data inputs can be utilized by those skilled in the art. Further, while the examples utilize same voltage levels for the multiplexers, it should be understood based on the foregoing that different voltage levels can be provided to the different multiplexers by those skilled in the art. In addition, while the first signal and the second signal of the differential data signal in the examples are of the same voltage, and power strength, scaling and shifting techniques can be used by those skilled in the art based on the forgoing to generate the differential data signal with different voltages, and power characteristics for the first and second signals.

While the invention has been described in conjunction with the specific exemplary embodiments thereof, it is evident that many alternatives, modifications, and variations will be apparent to those skilled in the art. Accordingly, exemplary embodiments of the invention as set forth herein are intended to be illustrative, not limiting. There are changes that may be made without departing from the spirit and scope of the invention.

What is claimed is:

1. A circuit for generating a differential data signal, comprising:
a first switching element configured to selectively output a first output signal that switches between a first logic value and a second logic value in response to a data signal, wherein the first logic value in the first output signal is output in response to the first logic value in the data signal, and the second logic value in the first output signal is output in response to the second logic value in the data signal; and
a second switching element configured to selectively output a second output signal that switches between the first logic value and the second logic value inversely in response to the data signal, wherein the first logic value in the second output signal is output in response to the second logic value in the data signal, and the second logic value in the second output signal is output in response to the first logic value in the data signal.

2. The circuit of claim 1, wherein
the first switching element is configured to switch the first output signal from the first logic value to the second logic value with a delay to a first transition of the data signal from the first logic value to the second logic value; and
the second switching element is configured to switch the second output signal from the second logic value to the first logic value with substantially the same delay to the first transition of the data signal.

3. The circuit of claim 2, wherein
the first switching element is configured to switch the first output signal from the second logic value to the first logic value with substantially the same delay to a second transition of the data signal from the second logic value to the first logic value; and
the second switching element is configured to switch the second output from the first logic value to the second logic value with substantially the same delay to the second transition of the data signal.

4. The circuit of claim 1, wherein
the first switching element comprises:
   a first time balanced multiplexer having time balanced rise and fall; and
the second switching element comprises:
   a second time balanced multiplexer having time balanced rise and fall.

5. The circuit of claim 4, wherein
the first time balanced multiplexer receives the data signal at a first selector input, a first voltage supply at a first input and a second voltage supply at a second input, selects the first input in response to the first logic value at the first selector input, and selects the second input in response to the second logic value at the first selector input; and
the second time balanced multiplexer receives the data signal at a second selector input, the second voltage supply at a third input and the first voltage supply at a fourth input, selects the third input in response to the first logic value at the second selector input, and selects the fourth input in response to the second logic value at the second selector input.

6. The circuit of claim 5, wherein the first voltage supply is Vdd, and the second voltage supply is ground.

7. The circuit of claim 1, wherein the first logic value corresponds is logic one, and the second logic value is logic zero.

8. A network device, comprising:
a serializer unit configured to receive a set of parallel data streams, and convert the set of parallel data streams into a serial data stream; and
a differential signal generator unit configured to generate a differential data stream having a positive data stream and a negative data stream, the differential signal generator having:
   a first switching element configured to selectively output the positive data stream that switches between a first logic value and a second logic value in response to the serial data stream, wherein the first logic value in the positive data stream is output in response to the first logic value in the serial data stream, and the second logic value in the positive data stream is output in response to the second logic value in the serial data stream; and
   a second switching element configured to selectively output the negative data stream that switches between the first logic value and the second logic value inversely in response to the serial data stream, wherein the first logic value in the negative data stream is output in response to the second logic value in the serial data stream, and the second logic value in the second output signal is output in response to the first logic value in the serial data stream.

9. The network device of claim 8, wherein
the first switching element is configured to switch the positive data stream from the first logic value to the second logic value with a delay to a first transition of the serial data stream from the first logic value to the second logic value; and
the second switching element is configured to switch the negative data stream from the second logic value to the first logic value with substantially the same delay to the first transition of the serial data stream.

10. The network device of claim 9, wherein
the first switching element is configured to switch the positive data stream from the second logic value to the first logic value with substantially the same delay to a second transition of the serial data stream from the second logic value to the first logic value; and
the second switching element is configured to switch the negative data stream from the first logic value to the second logic value with substantially the same delay to the second transition of the serial data stream.

11. The network device of claim 8, wherein
the first switching element comprises:
   a first time balanced multiplexer having time balanced rise and fall; and
the second switching element comprises:
   a second time balanced multiplexer having time balanced rise and fall.

12. The network device of claim 11, wherein
the first time balanced multiplexer receives the serial data stream at a first selector input, a first voltage supply at a first input, and a second voltage supply at a second input, selects the first input in response to the first logic value at the first selector input, and selects the second input in response to the second logic value at the first selector input; and
the second time balanced multiplexer receives the serial data stream at a second selector input, the second voltage supply at a third input, and the first voltage supply at a fourth input, selects the third input in response to the first logic value at the second selector input, and selects the fourth input in response to the second logic value at the second selector input.

13. The network device of claim 12, wherein the first voltage supply is Vdd, and the second voltage supply is ground.

14. The network device of claim 8, wherein the first logic value is logic one, and the second logic value is logic zero.

15. A network device, comprising:
a deserializer unit configured to receive a differential data stream generated by a switching based differential signal generator, the differential data stream having a first data stream and a second data stream, wherein the switching based differential signal generator comprises:
   a first switching element configured to selectively output the first data stream that switches between a first logic value and a second logic value in response to a serial data stream, wherein the first logic value in the first data stream is output in response to the first logic value in the serial data stream, and the second logic value in the first data stream is output in response to the second logic value in the serial data stream; and
   a second switching element configured to selectively output the second data stream that switches between the first logic value and the second logic value inversely in response to the serial data stream, wherein the first logic value in the second data stream is output in response to the second logic value in the serial data stream, and the second logic value in the second output signal is output in response to the first logic value in the serial data stream.

16. The network device of claim 15, wherein
the first switching element is configured to switch the first data stream from the first logic value to the second logic value with a delay to a first transition of the serial data stream from the first logic value to the second logic value; and
the second switching element is configured to switch the second data stream from the second logic value to the first logic value with substantially the same delay to the first transition of the serial data stream.

17. The network device of claim 16, wherein
the first switching element is configured to switch the first data stream from the second logic value to the first logic value with substantially the same delay to a second transition of the serial data stream from the second logic value to the first logic value; and
the second switching element is configured to switch the second data stream from the first logic value to the second logic value with substantially the same delay to the second transition of the serial data stream.

18. The network device of claim 15, wherein
the first switching element comprises:
  a first time balanced multiplexer having time balanced rise and fall; and
the second switching element comprises:
  a second time balanced multiplexer having time balanced rise and fall.

19. The network device of claim 18, wherein
the first time balanced multiplexer receives the serial data stream at a first selector input, a first voltage supply at a first input and a second voltage supply at a second input, selects the first input in response to the first logic value at the first selector input, and selects the second input in response to the second logic value at the first selector input; and
the second time balanced multiplexer receives the serial data stream at a second selector input, the second voltage supply at a third input and the first voltage supply at a fourth input, selects the third input in response to the first logic value at the second selector input, and selects the fourth input in response to the second logic value at the second selector input.

20. The network device of claim 19, wherein the first voltage supply is Vdd, and the second voltage supply is ground.

* * * * *